(12) United States Patent
Dimitrakopoulos et al.

(10) Patent No.: US 8,680,511 B2
(45) Date of Patent: Mar. 25, 2014

(54) BILAYER GATE DIELECTRIC WITH LOW EQUIVALENT OXIDE THICKNESS FOR GRAPHENE DEVICES

(75) Inventors: Christos D. Dimitrakopoulos, Yorktown Heights, NY (US); Damon B. Farmer, White Plains, NY (US); Alfred Grill, White Plains, NY (US); Yu-Ming Lin, West Harrison, NY (US); Deborah A. Neumayer, Danbury, CT (US); Dirk Pfeiffer, Croton on Hudson, NY (US); Wenjuan Zhu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 13/369,901

(22) Filed: Feb. 9, 2012

(65) Prior Publication Data

US 2013/0207080 A1 Aug. 15, 2013

(51) Int. Cl.
*H01L 29/06* (2006.01)
(52) U.S. Cl.
USPC ............ 257/24; 257/77; 438/20; 438/149; 438/194
(58) Field of Classification Search
USPC ............ 257/24, 77; 438/20, 149, 194
See application file for complete search history.

(56) References Cited

U.S. PATENT DOCUMENTS

| | | | |
|---|---|---|---|
| 2003/0116804 A1* | 6/2003 | Visokay et al. | 257/350 |
| 2009/0020764 A1* | 1/2009 | Anderson et al. | 257/77 |
| 2010/0109712 A1* | 5/2010 | Zaliznyak et al. | 327/100 |
| 2011/0233513 A1 | 9/2011 | Dimitrakopoulos et al. | |
| 2011/0284818 A1 | 11/2011 | Avouris et al. | |

OTHER PUBLICATIONS

Ramachandran, V., et al., "Preparation of Atomically Flat Surfaces on Silicon Carbide Using Hydrogen Etching", Journal of Electronic Materials, Apr. 1998, vol. 27, No. 4.

* cited by examiner

*Primary Examiner* — Jami M Valentine
(74) *Attorney, Agent, or Firm* — Scully, Scott, Murphy & Presser, P.C.; Louis J. Percello, Esq.

(57) ABSTRACT

A silicon nitride layer is provided on an uppermost surface of a graphene layer and then a hafnium dioxide layer is provided on an uppermost surface of the silicon nitride layer. The silicon nitride layer acts as a wetting agent for the hafnium dioxide layer and thus prevents the formation of discontinuous columns of hafnium dioxide atop the graphene layer. The silicon nitride layer and the hafnium dioxide layer, which collectively form a low EOT bilayer gate dielectric, exhibit continuous morphology atop the graphene layer.

27 Claims, 9 Drawing Sheets

BILAYER GATE DIELECTRIC WITH LOW EQUIVALENT OXIDE THICKNESS FOR GRAPHENE DEVICES

STATEMENT REGARDING FEDERALLY SPONSORED RESEARCH OR DEVELOPMENT

This disclosure was made with Government support under Contract No. FA8650-08-C-7838 awarded by Defense Advanced Research Projects Agency (DARPA). The Government thus may have certain rights in this disclosure.

BACKGROUND

The present disclosure relates to a semiconductor structure and a method of fabricating the same. More particularly, the present disclosure relates to a semiconductor structure including a bilayer gate dielectric with a low equivalent oxide thickness (EOT) that is formed atop graphene, and a method of forming the same.

Several trends presently exist in the semiconductor and electronics industry including, for example, devices are being fabricated that are smaller, faster and require less power than the previous generations of devices. One reason for these trends is that personal devices such as, for example, cellular phones and personal computing devices, are being fabricated that are smaller and more portable. In addition to being smaller and more portable, personal devices also require increased memory, more computational power and speed. In view of these ongoing trends, there is an increased demand in the industry for smaller and faster transistors used to provide the core functionality of the integrated circuits used in these devices.

Accordingly, in the semiconductor industry there is a continuing trend toward fabricating integrated circuits (ICs) with higher densities. To achieve higher densities, there has been, and continues to be, efforts toward down scaling the dimensions of the devices on semiconductor wafers generally produced from bulk silicon. These trends are pushing the current technology to its limits. In order to accomplish these trends, high densities, smaller feature sizes, smaller separations between features, and more precise feature shapes are required in integrated circuits (ICs).

Significant resources go into down scaling the dimensions of devices and increasing packing densities. For example, significant time may be required to design such down scaled transistors. Moreover, the equipment necessary to produce such devices may be expensive and/or processes related to producing such devices may have to be tightly controlled and/or be operated under specific conditions. Accordingly, there are significant costs associated with exercising quality control over semiconductor fabrication.

In view of the above, the semiconductor industry is pursuing graphene to achieve some of the aforementioned goals. Graphene, which is essentially a flat sheet of carbon atoms, is a promising material for radio frequency (RF) transistors and other electronic transistors. Typical RF transistors are made from silicon, alloys of Si, e.g., SiGe, or more expensive semiconductors such as, for example, indium phosphide (InP).

SUMMARY

A silicon nitride layer is provided on an uppermost surface of a graphene layer and then a hafnium dioxide layer is provided on an uppermost surface of the silicon nitride layer. The silicon nitride layer acts as a wetting agent for the hafnium dioxide layer and thus prevents the formation of discontinuous columns of hafnium dioxide atop the graphene layer. The silicon nitride layer and the hafnium dioxide layer, which collectively form a bilayer gate dielectric, exhibit continuous morphology atop the graphene layer. Moreover, the bilayer gate dielectric of the present disclosure has a low equivalent oxide thickness (EOT). EOT is the thickness of $SiO_2$ that would produce the same specific capacitance with that of a dielectric with a higher dielectric constant. The higher the dielectric constant of the dielectric, the lower the EOT, for the same thickness of the dielectric. By "low EOT" in general it is meant that the EOT of a dielectric stack is less that half the real total thickness of the dielectric stack, and more specifically, any EOT values lower than 20 nm is defined here as "low EOT".

In one aspect of the present disclosure, a semiconductor structure is provided. The semiconductor structure of the present disclosure includes a graphene layer located on an uppermost surface of a base substrate. A bilayer gate dielectric is located on an uppermost surface of the graphene layer. The bilayer gate dielectric includes, from bottom to top, a silicon nitride layer and a hafnium dioxide ($HfO_2$) layer. In the semiconductor structure of the present disclosure, the silicon nitride layer and the $HfO_2$ layer are both continuously present atop the uppermost surface of the graphene layer.

In another aspect of the present disclosure, a semiconductor device is provided. The semiconductor device of the present disclosure includes a base substrate having an uppermost surface and a graphene-containing semiconductor device located on the uppermost surface of the base substrate. The graphene-containing semiconductor device of the present disclosure includes a graphene layer located on the uppermost surface of the base substrate, and a bilayer gate dielectric located on an uppermost surface of the graphene layer. The bilayer gate dielectric includes, from bottom to top, a silicon nitride layer and a hafnium dioxide ($HfO_2$) layer. In the semiconductor device of the present disclosure, the silicon nitride layer and the $HfO_2$ layer are both continuously present atop the uppermost surface of the graphene layer.

In yet another aspect of the present disclosure, a method is provided. The method of the present disclosure includes providing a graphene layer on an uppermost surface of a base substrate. A silicon nitride layer is then formed on an uppermost surface of the graphene layer. A hafnium dioxide ($HfO_2$) layer is then formed on an uppermost surface of the silicon nitride layer. In accordance with the present disclosure, the silicon nitride layer and the $HfO_2$ layer are continuously present atop the uppermost surface of said graphene layer.

In comparative structures and methods in which hafnium dioxide is formed directly on an uppermost surface of a graphene layer, applicants observed that the resultant hafnium dioxide layer balled up forming discontinuous columns of hafnium dioxide atop the graphene layer. The resulting discontinuous columnar growth of $HfO_2$ is inappropriate for top-gate dielectric disclosures, due to the numerous leakage paths in the discontinuous material.

DETAILED DESCRIPTION

Figure 1:
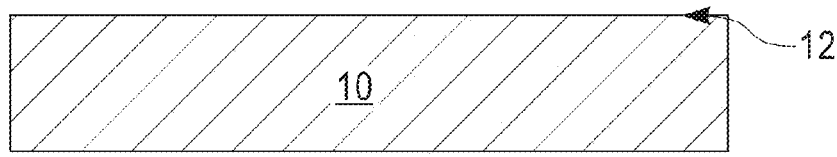
FIG. 1 is a pictorial representation (through a cross sectional view) of a base substrate that can be employed in one embodiment of the present disclosure.

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present.

Many inorganic dielectric materials when deposited on graphene form discontinuous thin films due to the low surface energy of graphene. The deposited inorganic dielectric material balls up on graphene driven by the minimization of interfacial energy that is ensured by preserving the free surface area of the material with the lowest surface energy.

In order to improve the performance of top-gated graphene field effect transistors (FETs), low-leakage, high dielectric constant (high-k) dielectrics with relatively low EOT are required. EOT indicates how thick a silicon oxide film would need to be to produce the same effect as the high-k material being used. The term is often used when describing field effect transistors which rely on an electrically insulating layer between a gate and a doped region. Device performance has typically been improved by reducing the thickness of silicon oxide. As the thickness of a silicon oxide approaches 5-10 nm, leakage is generally observed and alternate materials are typically employed to increase the thickness while retaining the switching speed. Materials having larger dielectric constants enable thicker films to be used for this purpose while retaining fast reaction of the transistor.

The present disclosure provides a silicon nitride layer on an uppermost surface of a graphene layer and then a hafnium dioxide layer is provided on an uppermost surface of the silicon nitride layer. The silicon nitride layer acts as a wetting agent for the hafnium dioxide layer and thus prevents the formation of discontinuous columns of hafnium dioxide atop the graphene layer. The silicon nitride layer and the hafnium dioxide layer, which collectively form a bilayer gate dielectric, exhibit continuous morphology atop the graphene layer.

Reference is first made to FIGS. 1-5 which illustrate one embodiment of the present disclosure. This embodiment begins by providing a base substrate 10 that has an uppermost surface 12 as is shown, for example, in FIG. 1. The base substrate 10 can be a semiconductor material, a dielectric material, a conductive material or any combination thereof including a multilayered stack. The base substrate 10 can be provided utilizing techniques that are well known to those skilled in the art.

The term "semiconductor material" as used throughout the present disclosure denotes any material that has semiconducting properties. Examples of semiconductor materials that can be employed in the present disclosure as base substrate 10 include, but are not limited to, Si, SiGe, SiGeC, SiC, Ge alloys, GaAs, InAs, InP, BN and other III/V or II/VI compound semiconductors. In addition to these listed types of semiconductor materials, the semiconductor material that can be employed as base substrate 10 can also be a layered semiconductor such as, for example, Si/SiGe, Si/SiC, silicon-oninsulators (SOIs) or silicon germanium-on-insulators (SGOIs), BN and other III/V or II/VI compound semiconductors. In some embodiments of the present disclosure, the semiconductor material that can be employed as base substrate 10 is a Si-containing semiconductor material, i.e., a semiconductor material that includes silicon. In one embodiment, SiC is employed as the base substrate 10. The semiconductor material that can be employed as the base substrate 10 can be single crystalline, polycrystalline, multicrystalline, and/or hydrogenated-amorphous. The semiconductor materials that can be employed as the base substrate 10 can be undoped, doped or contain doped and undoped regions therein.

The dielectric material that can be employed as base substrate 10 includes any material having insulating properties. Examples of dielectric materials that can be employed as base substrate 10 include, but are not limited to, glass, $SiO_2$, SiN, plastic, diamond-like carbon, BN, $C_xBN$ or a mixture of amorphous/hexagonal bonding boron nitride and carbon boron nitride.

The conductive material that can be used as base substrate 10 includes any material having electrical conductive properties. Examples of conductive materials that can be employed as base substrate 10 include, but are not limited to, a metal, or a transparent conductor including, for example, a metal oxide or conductive forms of carbon.

Figure 2:
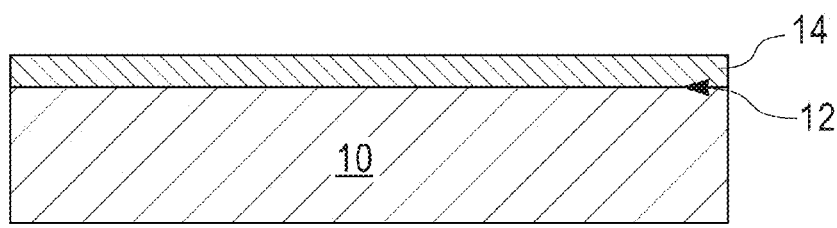
FIG. 2 is a pictorial representation (through a cross sectional view) illustrating the base substrate of FIG. 1 after providing a graphene layer to an uppermost surface of the base substrate.

Referring now to FIG. 2, there is illustrated the structure of FIG. 1 after providing a graphene layer 14 on the uppermost surface 12 of base substrate 10. The term "graphene" as used throughout the present disclosure denotes a one-atom-thick planar sheet of $sp^2$-bonded carbon atoms that are densely packed in a honeycomb crystal lattice. The graphene employed as graphene layer 14 has a two-dimensional (2D) hexagonal crystallographic bonding structure. The graphene that can be employed as graphene layer 14 can be comprised of single-layer graphene (nominally 0.34 nm thick), few-layer graphene (2-10 graphene layers), multi-layer graphene (>10 graphene layers), a mixture of single-layer, few-layer, and multi-layer graphene, or any combination of graphene layers mixed with amorphous and/or disordered carbon phases. The graphene employed as graphene layer 14 can also include, if desired, substitutional, interstitial and/or intercalated dopant species as well.

The graphene layer 14 that can be provided to the uppermost surface 12 of the base substrate 10 can be formed utilizing well known techniques. For example, the graphene layer 14 can be formed by mechanical exfoliation of graphite, epitaxial growth on silicon carbide, epitaxial growth on metal substrates, hydrazine reduction in which a graphene oxide paper is placed in a solution of pure hydrazine which reduces the graphene oxide paper into single-layered graphene, and sodium reduction of ethanol, i.e., by the reduction of ethanol by sodium metal, followed by pyrolysis of the ethoxide product and washing to remove sodium salts. Another method of providing a graphene layer 12 can be from carbon nanotubes.

In one embodiment, a graphene layer 14 can be formed on the uppermost surface 12 of a base substrate 10 comprised of SiC by first cleaning the uppermost surface of the SiC substrate by performing a first anneal in a dilute silicon-containing ambient (e.g., a silane-containing or Si-vapor-containing). The first anneal that can be used to clean the uppermost surface of the SiC substrate is typically performed at a temperature from about 800° C. up to, but not beyond the melting point of silicon in a dilute silicon-containing ambient, with a first anneal temperature from 810° C. to 1250° C. being more typical. The first anneal in a dilute silicon-containing ambient can be performed at two different temperatures, typically at 810° C. and 1140° C. The anneal techniques mentioned in forming the graphene layer 14 can also be referred to as an epitaxial growth process. As such, the graphene layer 14 has an epitaxial relation to the SiC substrate. That is, the graphene layer that is formed by an epitaxial growth process has a lattice structure and orientation that is commensurate to that of the SiC substrate. This enables a high-purity starting point for building graphene-based semiconductor devices.

As mentioned above, the first anneal is performed in a dilute silicon-containing ambient, preferably a silane-containing ambient. By "silane-containing ambient" it is meant any atmosphere that includes at least one compound of hydrogen and silicon that has the general formula $Si_nH_{2n+2}$ wherein n is any integer, particularly n is from 1 to 2. Examples of silanes that can be employed within the silane-containing ambient include, but are not limited to, silane, disilane and mixtures thereof. Alternatively, a beam of evaporated Si atoms can play the role of the cleaning agent. By 'cleaning', it is meant the removal of $SiO_2$ to more volatile SiO that leaves the surface, and the conversion of non-carbidic C to Si—C. The silane-containing ambient is typically diluted with an inert gas including for example, at least one of He, Ne, Ar, Kr and Xe. In one embodiment, the content of silane within the dilute silane-containing ambient is typically from 2% to 100% based on the total amount of the dilute silane-containing ambient. In another embodiment, the content of silane within the dilute silane-containing ambient is 20% based on the total amount of the dilute silane-containing ambient.

In a different embodiment, the SiC surface cleaning and preparation takes place by etching several of the top SiC surface layers in a hydrogen-containing atmosphere at temperatures up to 1700° C. and pressures up to atmospheric, as taught, for example, by V. Ramachandran, M. F. Brady, A. R. Smith, R. M. Feenstra and D. W. Greve, *J. Electron. Mater.* 27, 308, (1998).

After performing one of the above surface preparation anneals (e.g., first anneal), a second anneal is performed that grows graphene on the uppermost surface of the SiC substrate. The second anneal is typically performed in an inert ambient or in vacuum and at a temperature from 1400° C. to 2000° C., with a second anneal temperature from 1450° C. to 1600° C. being more typical. By "inert ambient" it is meant a non-reactive gas including at least one of He, Ne, Ar, Kr and Xe. In one embodiment of the present disclosure, the second anneal is performed in Ar. During the second anneal, silicon is released from the uppermost surface of the SiC substrate forming a graphene layer thereon.

In some embodiments of the present disclosure, an intermediate anneal is performed between the first and second anneals. When an intermediate anneal is performed, the intermediate anneal is performed in another dilute silicon-containing ambient and at an intermediate temperature that is between the temperature of the first anneal, and the temperature of the second anneal. The another dilute silicon-containing ambient may be the same or different than the dilute silane-containing ambient used in the first anneal. The intermediate temperature is typically from 1050° C. to 1250° C., depending on the silane concentration in the reactor, with an intermediate anneal temperature from 1100° C. to 1200° C. being more typical.

In some embodiments of the present disclosure, the first anneal and the optional intermediate anneal can be omitted and the graphene layer 14 can be formed by only annealing at a temperature from 1400° C. to 2000° C. in an inert ambient.

Notwithstanding the technique employed in forming the graphene layer 14, the graphene layer 14 that is provided has a thickness that is typically within a range from 0.34 nm to 2 nm, with a thickness from 0.34 nm to 0.68 nm being more typical (one to two graphene monolayers).

Figure 3:
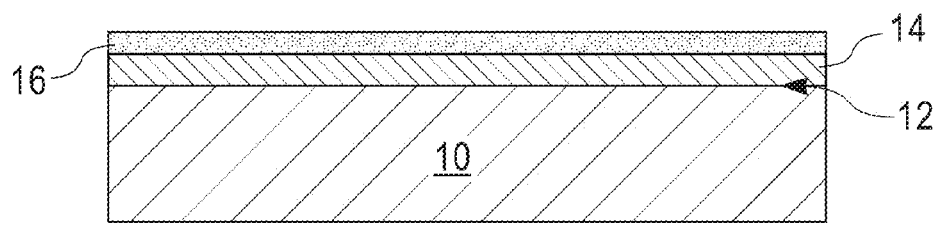
FIG. 3 is a pictorial representation (through a cross sectional view) illustrating the structure of FIG. 2 after forming a silicon nitride (SiN) layer, which represents a lower layer of a bilayer gate dielectric of the present disclosure, on an uppermost surface of the graphene layer.

Referring now to FIG. 3, there is illustrated the structure of FIG. 2 after forming a silicon nitride (SiN) layer 16 on an uppermost surface of the graphene layer 14. The SiN layer 16, which represents a lower layer of a bilayer gate dielectric of the present disclosure, is a continuous layer which contains no gaps or pin holes which expose any portion of the underlying graphene layer 14. The SiN layer 16 that is employed in the present disclosure wets the graphene layer 14 (i.e., the SiN serves as a wetting agent for $HfO_2$) and thus provides a template for forming a continuous $HfO_2$ layer thereon.

The SiN layer 16 that is employed in the present disclosure can be formed utilizing conventional deposition processes and precursors that are well known to those skilled in the art. For example, the SiN layer 16 can be formed by atomic layer deposition (ALD), plasma enhanced atomic layer deposition (PE-ALD), chemical vapor deposition (CVD), sputtering, and plasma enhanced chemical vapor deposition (PECVD). In one embodiment, a PECVD process is used at a temperature from 350° C. to 450° C. to form a tensile SiN layer as SiN layer 16.

In the present disclosure, the SiN layer 16 that is formed on the uppermost surface of the graphene layer 14 is a thin layer which typically has a thickness from 1 nm to 15 nm. More typically, the SiN layer 16 that is formed on the uppermost surface of the graphene layer 14 has a thickness from 1 nm to 5 nm. SiN forms smooth continuous films on graphene, while many other dielectrics, like $HfO_2$ form discontinuous, columnar growths on graphene. Thus, since it is desirable to use $HfO_2$ as a gate dielectric on graphene, due to its high dielectric constant, a thin layer of SiN is employed herein as a "wetting" layer on which $HfO_2$ grows in the form of a continuous layer. In the interest of depositing a low EOT gate dielectric stack, and because $HfO_2$ has a higher dielectric constant than SiN, a minimum thickness of SiN is used in the present disclosure to ensure growth of $HfO_2$ in the form of a continuous layer.

Figure 4:
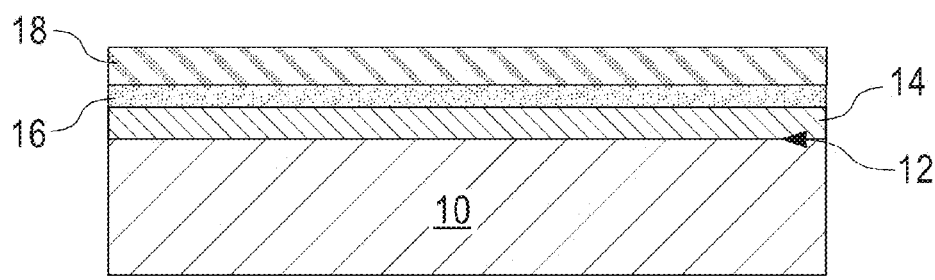
FIG. 4 is a pictorial representation (through a cross sectional view) illustrating the structure of FIG. 3 after forming a hafnium dioxide (HFO$_2$) layer, which represents an uppermost layer of the bilayer gate dielectric of the present disclosure.

Referring now to FIG. 4, there is illustrated the structure of FIG. 3 after forming a hafnium dioxide ($HfO_2$) layer 18 on the uppermost surface of the SiN layer 16. The $HfO_2$ layer 18 represents an uppermost layer of the bilayer gate dielectric of the present disclosure. The $HfO_2$ layer 18 that is formed atop the SiN layer 16 is present continuously atop the SiN layer 16 and no gaps or pin holes are present in the $HfO_2$ layer which may lead to leakage within the material stack when the bilayer gate dielectric is employed as a dielectric component of a graphene-containing semiconductor device.

Figure 12A:
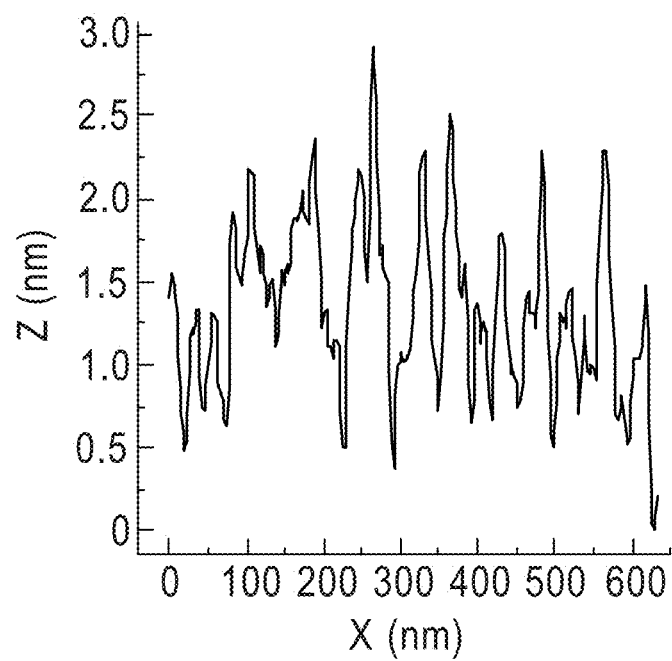
FIGS. 12A and 12B which correspond to FIGS. 11B and 11C respectively, are cross section AFM images at different magnifications illustrating the roughness of the HfO$_2$ layer that was formed atop the SiN layer as in accordance with Example 1 of the present disclosure.
Figure 12B:
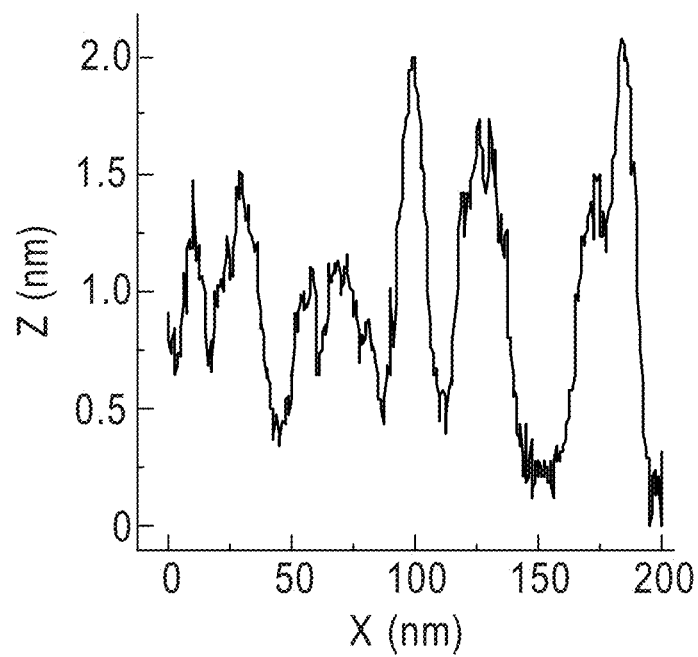

The term "continuous" when used to describe the morphology of the SiN layer and the $HfO_2$ layer atop the graphene layer denotes that there are no breaks or interruption of either of the material layers atop the graphene layer. In other words, the SiN layer and the $HfO_2$ layer provide complete surface coverage of the underlying graphene layer and as such no gaps or pin holes are present in either the SiN layer or the $HfO_2$ layer that would lead to any exposure of the graphene layer. SiN by itself, due to its low thickness in an embodiment of the present disclosure (2 nm) would not be able to reduce gate leakage at the desirable levels if the thicker and more robust $HfO_2$ layer presented any through-the-film discontinuities. FIGS. 12A and 12B, show crevices starting from the surface of the 10 nm thick $HfO_2$ that have a depth of only 2 nm (surface roughness). Thus, these intrusions do not create through-the-film openings (e.g., pinholes or gaps) that would short the device. This is a result of the SiN wetting layer. Without the wetting layer, the $HfO_2$ film is discontinuous and full of pinholes and/or gaps. Since the SiN layer and the $HfO_2$ layer are continuously present atop the graphene layer, the bilayer gate dielectric of the present disclosure when used as an element of an operating graphene-containing semiconductor device reduces leakage as compared to similar graphene-containing devices in which $HfO_2$ is formed directly on an uppermost surface of the graphene layer.

In cases in which a $HfO_2$ layer is formed directly upon the uppermost surface of the graphene layer 14, applicants observed that the $HfO_2$ layer balls up forming discontinuous columns (i.e., islands) of $HfO_2$ atop the graphene layer. Such discontinuous columnar formation of $HfO_2$ is inappropriate for top-gate dielectric disclosures, due to the numerous leakage paths in the discontinuous $HfO_2$ layer.

The $HfO_2$ layer 18 of the present disclosure can be formed by methods well known in the art. In one embodiment of the present disclosure, the $HfO_2$ layer 18 can be formed by a deposition process such as, for example, chemical vapor deposition (CVD), thermal or plasma enhanced chemical vapor deposition (PECVD), physical vapor deposition (PVD), molecular beam deposition (MBD), pulsed laser deposition (PLD), liquid source misted chemical deposition (LSMCD), and atomic layer deposition (ALD).

In the present disclosure, the $HfO_2$ layer 18 has a thickness that is greater than the thickness of the underlying SiN layer 16. Typically, the $HfO_2$ layer 18 has a thickness from 2 nm to 500 nm, with a thickness from 5 nm to 10 nm being more typical. In some embodiments, the $HfO_2$ layer 18 can have an effective oxide thickness on the order of, or less than, 1 nm.

Figure 5:
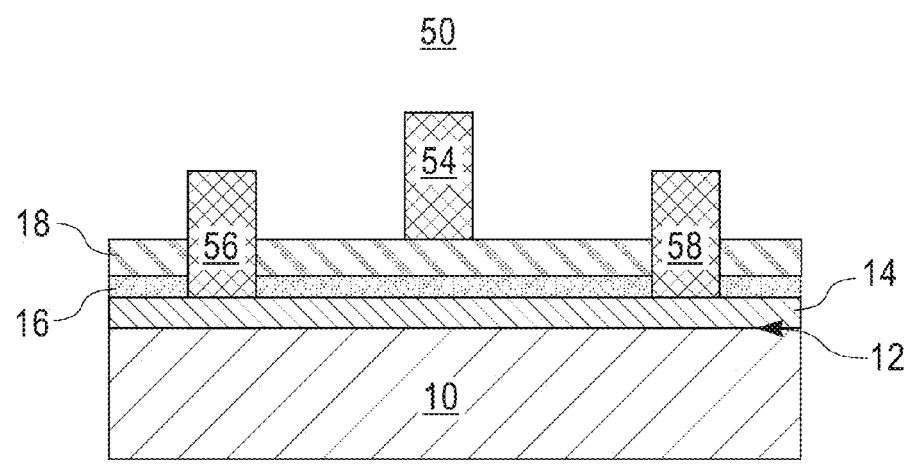
FIG. 5 is a pictorial representation (through a cross sectional view) illustrating a graphene-containing semiconductor device that can be formed using the structure shown in FIG. 4.

FIG. 5 is a pictorial representation (through a cross sectional view) illustrating a graphene-containing semiconductor device 50 that can be formed using the structure shown in FIG. 4. The graphene-containing semiconductor device 50 that can be formed, includes the bilayer gate dielectric (16 and 18) as the dielectric element of the semiconductor device. At least a portion of the graphene layer 14 can serve as the device's channel. Although FET devices are illustrated and described in detail herein below, the present disclosure is not limited to just those types of semiconductor devices. Instead, other semiconductor devices including, but not limited to, diodes, and BiCMOS, can be formed.

The graphene-containing semiconductor device 50 shown in FIG. 5 is formed by first providing the structure shown in FIG. 4. After forming the bilayer gate dielectric (16 and 18), a gate conductor 54 can be formed directly on the uppermost surface of the $HfO_2$ layer 18. The gate conductor 54 includes any conductive material including, but not limited to, polycrystalline silicon, polycrystalline silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. In one embodiment, the conductive material that can be employed as gate conductor 54 can be comprised of an nFET metal gate. In another embodiment, the conductive material that can be employed as gate conductor 54 can be comprised of a pFET metal gate. In a further embodiment, the conductive material that can be employed as gate conductor 54 can be comprised of polycrystalline silicon. The polysilicon conductive material can be used alone, or in conjunction with another conductive material such as, for example, a metal conductive material and/or a metal silicide material.

The conductive material that is employed as gate conductor 54 can be formed utilizing a conventional deposition process including, for example, chemical vapor deposition (CVD), plasma enhanced chemical vapor deposition (PECVD), physical vapor deposition (PVD), sputtering, atomic layer deposition (ALD) and other like deposition processes. When Si-containing materials are used as the conductive material, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process is employed. The as-deposited conductive material typically has a thickness from 1 nm to 100 nm, with a thickness from 3 nm to 30 nm being even more typical.

Following deposition of the conductive material, the conductive material is patterned by lithography and etching into the gate conductor 54.

The graphene-containing semiconductor device 50 further includes source region 56 and drain region 58 that make electrical contact to uppermost surface portions of the graphene layer 14. The source region 56 and the drain region 58 include one of the conductive materials mentioned above for gate conductor 54. The source region 56 and the drain region 58 can be formed by etching openings in the bilayer gate dielectric (16 and 18) and stopping on an uppermost surface of graphene layer 14. In one embodiment, phosphoric acid can be used to form the openings within the bilayer gate dielectric (16 and 18). A conductive material is then deposited. In some embodiments, lithography and etching can be used to pattern the deposited conductive material forming the source region 56 and drain region 58.

Figure 6:
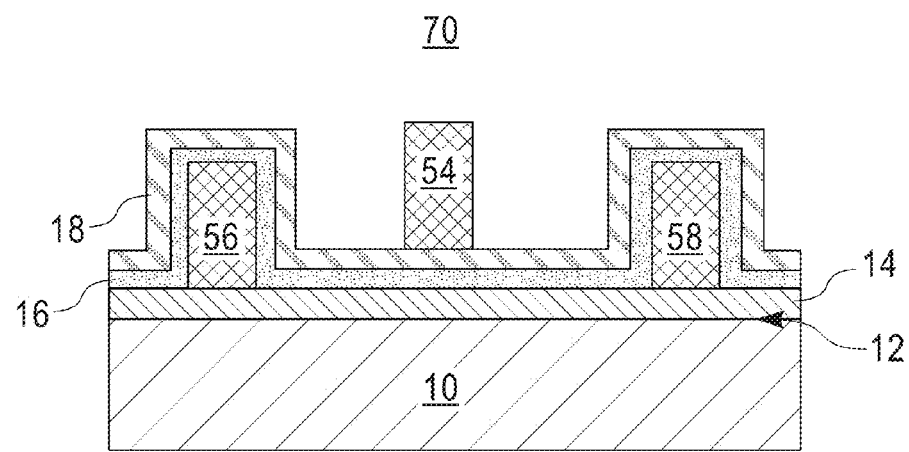
FIG. 6 is a pictorial representation (through a cross sectional view) illustrating another graphene-containing semiconductor device that can be formed using the bilayer gate dielectric of the present disclosure.

Reference is now made to FIG. 6 which illustrates another graphene-containing semiconductor device 70 that can be formed in the present disclosure. The another graphene-containing semiconductor device 70 includes base substrate 12, graphene layer 14, a bilayer gate dielectric (16 and 18), a gate conductor 54 located on a portion of the bilayer gate dielectric (16 and 18), and a source region 56 and a drain region 58 located on an uppermost surface of the graphene layer 14 and on opposite sides of the gate conductor 54. In this embodiment, a portion of the bilayer gate dielectric (16 and 18) is located on sidewalls and atop the source region 56 and the drain region 58. The elements of semiconductor device 70, which have like reference numerals as the elements of the semiconductor device 50, include the materials mentioned above. Semiconductor device 70 can be formed similar to the semiconductor device 50 mentioned above except that the source region 56 and drain region 58 are formed prior to forming the bilayer gate dielectric (16 and 18) and the gate conductor 54. In this embodiment, a conventional lift off process can be employed in forming the source region 56 and the drain region 58. Alternatively, the source region 56 and the drain region 58 can be formed by deposition, lithography and etching.

Figure 7:
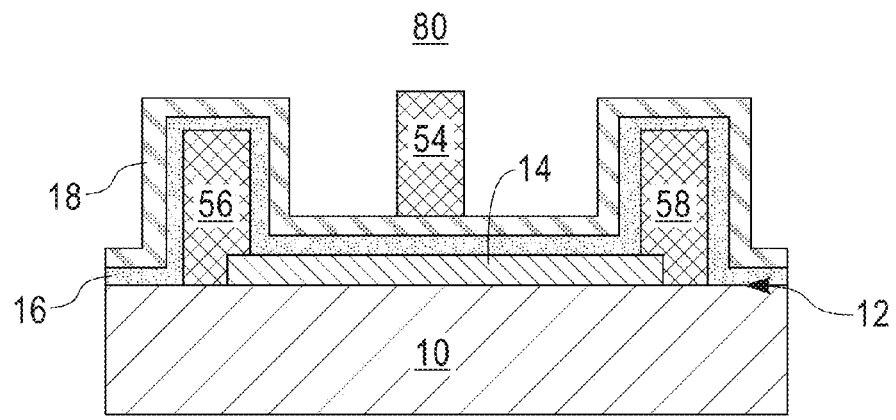
FIG. 7 is a pictorial representation (through a cross sectional view) illustrating a further graphene-containing semiconductor device that can be formed using the bilayer gate dielectric of the present disclosure.
Figure 8:
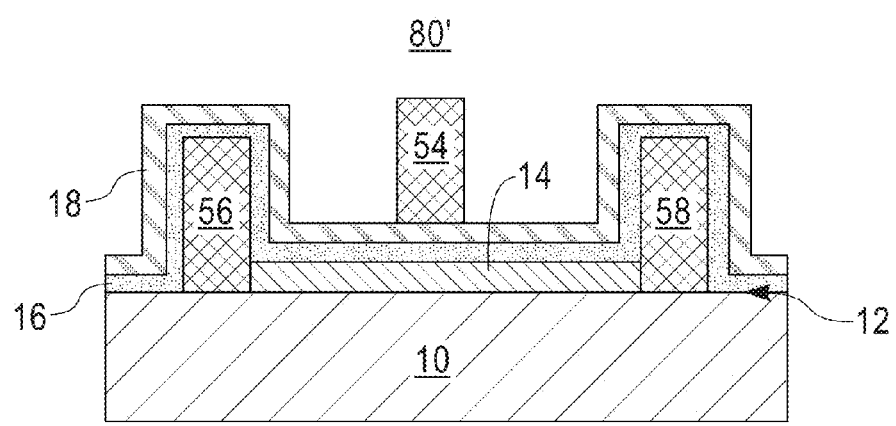
FIG. 8 is a pictorial representation (through a cross sectional view) illustrating an even further graphene-containing semiconductor device that can be formed using the bilayer gate dielectric of the present disclosure.

Reference is now made to FIGS. 7-8 which illustrate other graphene-containing semiconductor devices 80 and 80', respectively, that can be formed in the present disclosure. In these devices, a portion of the bilayer gate dielectric (16 and 18) is located on sidewalls and atop the source region 56 and the drain region 58, and the gate conductor 54 is in contact with the sidewalls of the bilayer gate dielectric (16 and 18) that are present on sidewalls of the source region 56 and the drain region 58. The elements of graphene-containing semiconductor devices 80 and 80', which have like reference numerals as the elements of the graphene-containing semiconductor device 50, include the materials mentioned above. Graphene-containing semiconductor devices 80 and 80' can be formed similar to the graphene-containing semiconductor device 70 mentioned above except that the graphene layer 14 is patterned prior to forming the source region 56 and drain region 58. In some embodiments, and as shown in FIG. 7, a portion of the source region 56 and a portion of drain region 58 are present atop the uppermost surface of the patterned graphene layer 14.

In another embodiment and as shown in FIG. 8, the patterned graphene layer 14 is located entirely between the source region 56 and the drain region 58. In this embodiment, an outermost vertical sidewall portion of the source region 56 is in direct contact with an outer vertical sidewall portion of the patterned graphene layer 14 and an outermost vertical sidewall portion of the drain region 58 is in direct contact with another outer vertical sidewall portion of the patterned graphene layer 14.

The following examples are provided to show some advantages that can be obtained by providing a graphene-containing structure including a SiN layer located between an underlying graphene layer and an overlying $HfO_2$ as compared to an equivalent graphene-containing structure that does not contain the SiN layer.

EXAMPLE 1

This example provides a graphene-containing structure which includes a SiN layer located between an underlying graphene layer and an overlying $HfO_2$. The structure was prepared by first providing a SiC base substrate and then epitaxially growing a graphene layer on an uppermost surface of the base substrate. The graphene layer was formed utilizing the annealing process mentioned in the above Detailed Description of the present disclosure. After providing the graphene layer atop the SiC base substrate, a 2 nm thick tensile SiN layer was formed by PECVD at 400° C. Next, a 10 nm thick $HfO_2$ layer was formed by ALD atop the SiN layer.

Figure 9A:
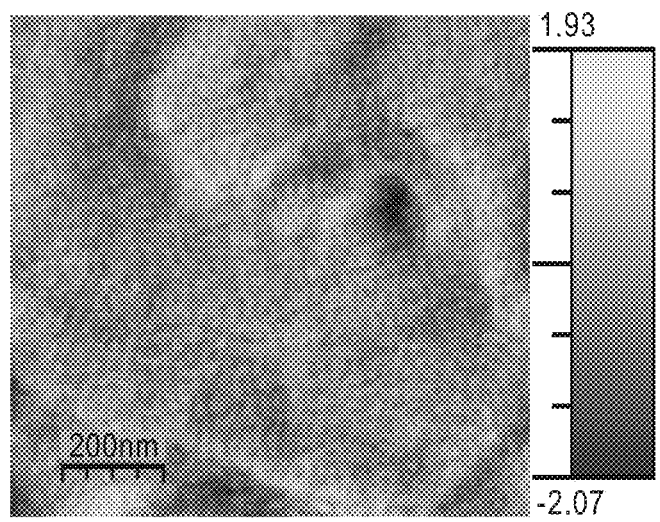
FIG. 9A is an actual AFM height image of a structure after forming a SiN layer atop a graphene layer as in accordance with Example 1 of the present disclosure. The Z-scale is shown on the right side.
Figure 9B:
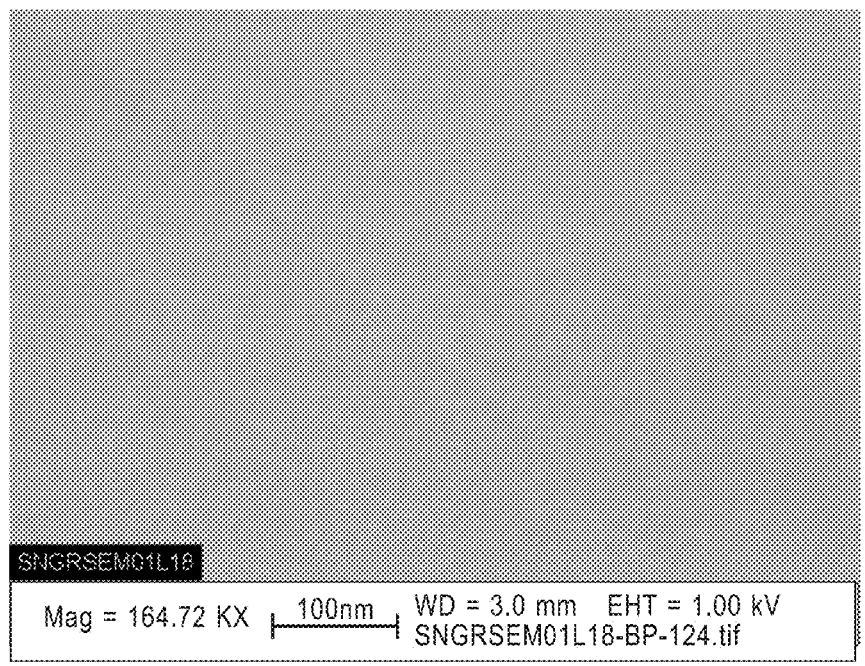
FIG. 9B is an actual SEM image of a structure after forming a SiN layer atop a graphene layer as in accordance with Example 1 of the present disclosure.
Figure 10:
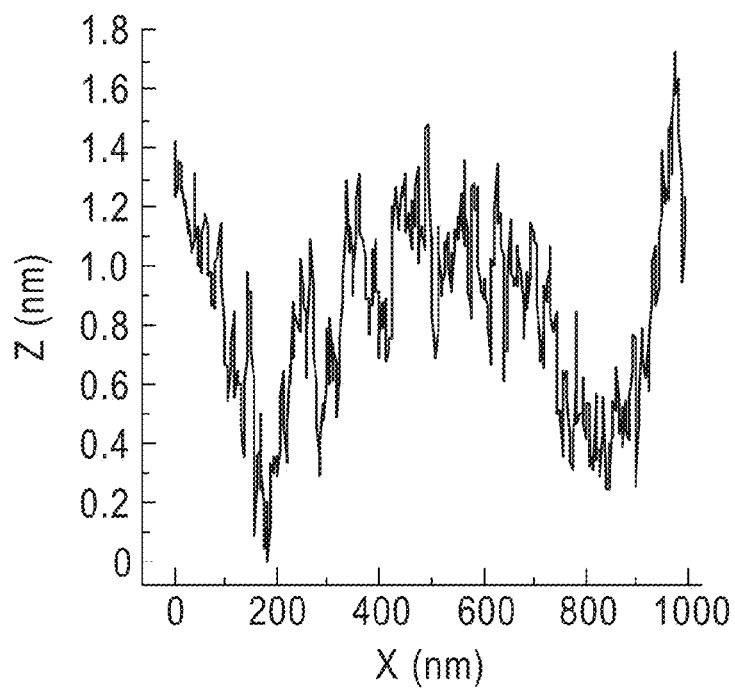
FIG. 10 is a cross section AFM image illustrating the roughness of the SiN layer depicted in FIG. 9A that was formed atop the graphene layer as in accordance with Example 1 of the present disclosure.

FIG. 9A is an actual AFM height image of the structure after forming the SiN layer atop the graphene layer in accordance with this example of the present disclosure. The Z-scale in nm is shown on the right side. Different topographic heights in the image are represented by different shades that correspond directly to the shaded z-scale bar on the right. FIG. 9B is an actual SEM image of the same structure as described for FIG. 9A. FIG. 10 is a cross section AFM image illustrating the roughness of the SiN layer depicted in FIG. 9A that was formed atop the graphene layer. The observed crevices into the SiN layer have a depth that is much lower than the thickness of the SiN layer, thus proving that these intrusions do not create through-the-film openings (e.g. pinholes or gaps).

The SEMs and AFMs provide evidence that the SiN layer was continuously presented atop the graphene layer. While some intrusions were observed in the SiN layer, those intrusions, as depicted in the cross sectional AFM, were at most 1 nm in depth. As such, the $HfO_2$ layer that is formed atop the SiN layer does not see any graphene.

Figure 11A:
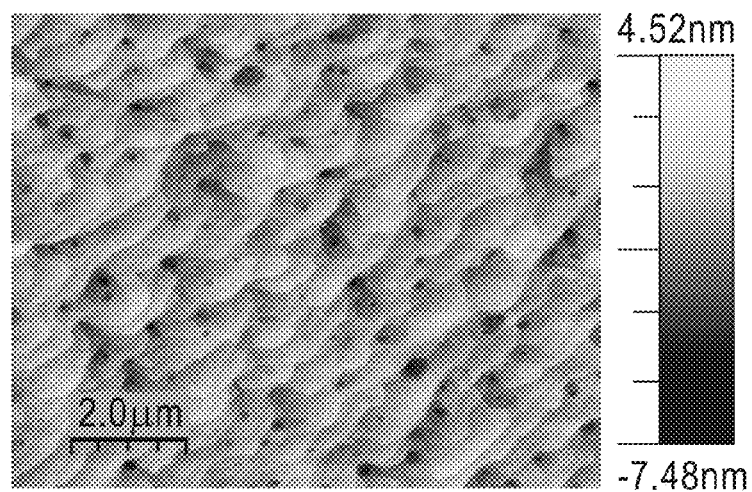
FIGS. 11A, 11B and 11C are actual AFM height images at different magnifications of a structure after forming a HfO$_2$ layer atop the SiN layer as in accordance with Example 1 of the present disclosure. The Z-scales are shown on the right side of each image.
Figure 11B:
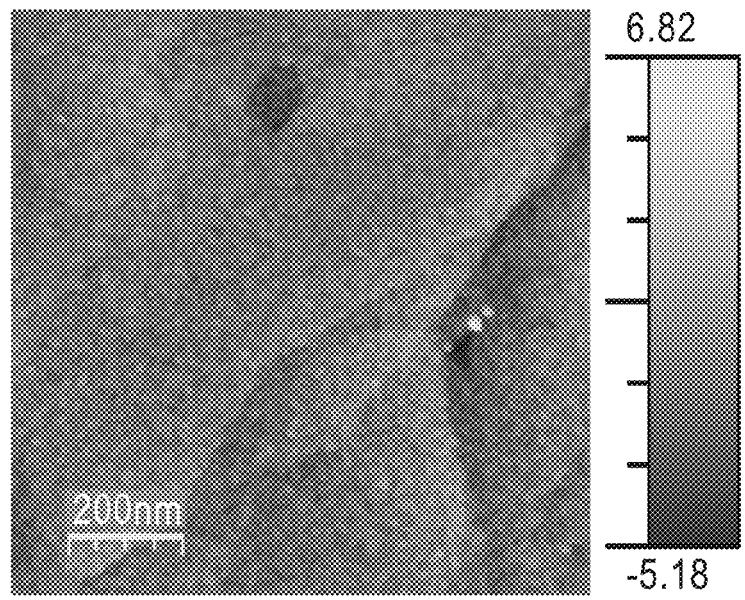
Figure 11C:
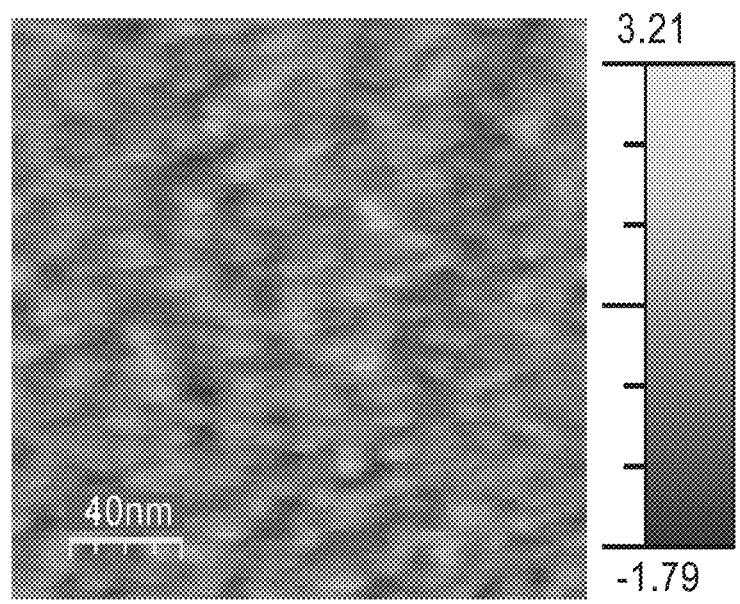

FIGS. 11A, 11B and 11C are actual AFM height images at different magnifications of a structure after forming the $HfO_2$ layer atop the SiN layer. The Z-scales in nm are shown on the right side of each image. Different topographic heights in the images are represented by different shades that correspond directly to the shaded z-scale bars on the right side of each image. FIGS. 12A and 12B which correspond to FIGS. 11B and 11C respectively, are representative cross section AFM images at different magnifications illustrating the roughness of the $HfO_2$ layer that was formed atop the SiN layer as in accordance with this example of the present disclosure. These images were taken on a randomly selected line segment, whose length corresponds to the X-axis length scale.

The SEMs and AFMs provide evidence that the HfO$_2$ layer was continuously presented atop the SiN. While some intrusions were observed in the HfO$_2$ layer, those intrusions, as depicted in the cross sectional AFMs, were at most 2 nm in depth. As such, the HfO$_2$ layer that was formed atop the SiN layer did not see any graphene. Moreover, since there were no gaps or pin holes present in the bilayer gate dielectric, no leakage paths are present therein.

EXAMPLE 2

This example provides a graphene-containing structure which a HfO$_2$ layer directly formed on an uppermost surface of a graphene layer. The structure was prepared by first providing a SiC base substrate and then epitaxially growing a graphene layer on an uppermost surface of the base substrate. The graphene layer was formed utilizing the annealing process mentioned in the above Detailed Description of the present disclosure. After providing the graphene layer atop the SiC base substrate, a 10 nm thick HfO$_2$ layer was formed by ALD directly on an uppermost surface of the graphene layer.

Figure 13:
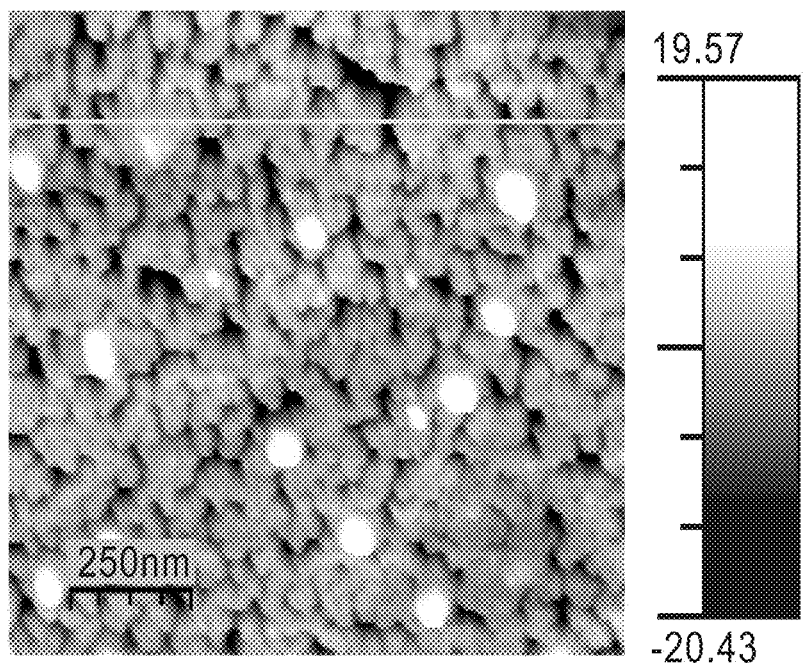
FIG. 13 is an actual AFM height image of a structure after forming a HfO$_2$ layer directly atop a graphene layer in accordance with Example 2 of the present disclosure. The Z-scale is shown on the right side.
Figure 14:
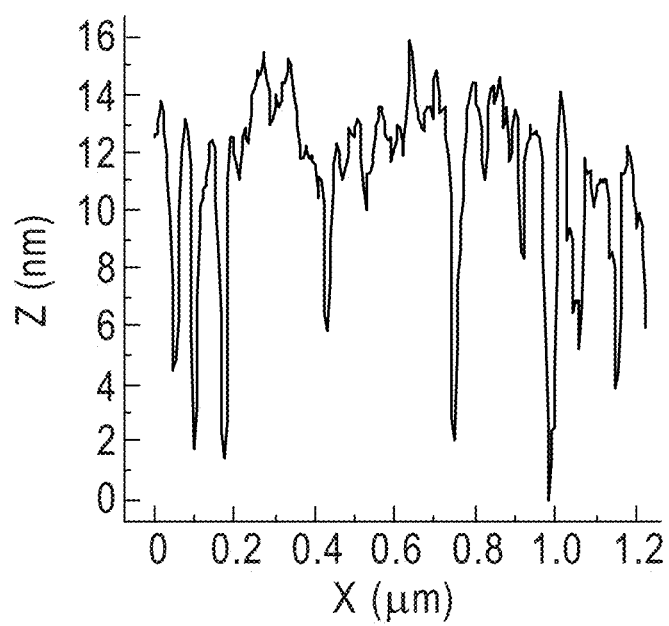
FIG. 14 is a cross section AFM image illustrating the roughness of the HfO$_2$ layer that was formed directly atop the graphene layer as in accordance with Example 2 of the present disclosure.

FIG. 13 is an actual AFM height image of a structure after forming the HfO$_2$ layer directly atop the graphene layer in accordance with this example of the present disclosure. The Z-scale is shown on the right side. FIG. 14 is a cross section AFM image illustrating the roughness of the HfO$_2$ layer that was formed directly atop the graphene layer.

The SEM and AFMs provide evidence that the HfO$_2$ layer was not continuously presented atop the graphene layer. Instead, intrusions were observed in the HfO$_2$ whose depth was, as depicted in the cross sectional AFM, about 12 nm. As such, the HfO$_2$ layer that was formed directly on the graphene layer did not wet effectively the graphene layer, and instead it balled up and gaps were present that can provide leakage paths from the top surface of the to the HfO$_2$ to the graphene.

Figure 15:
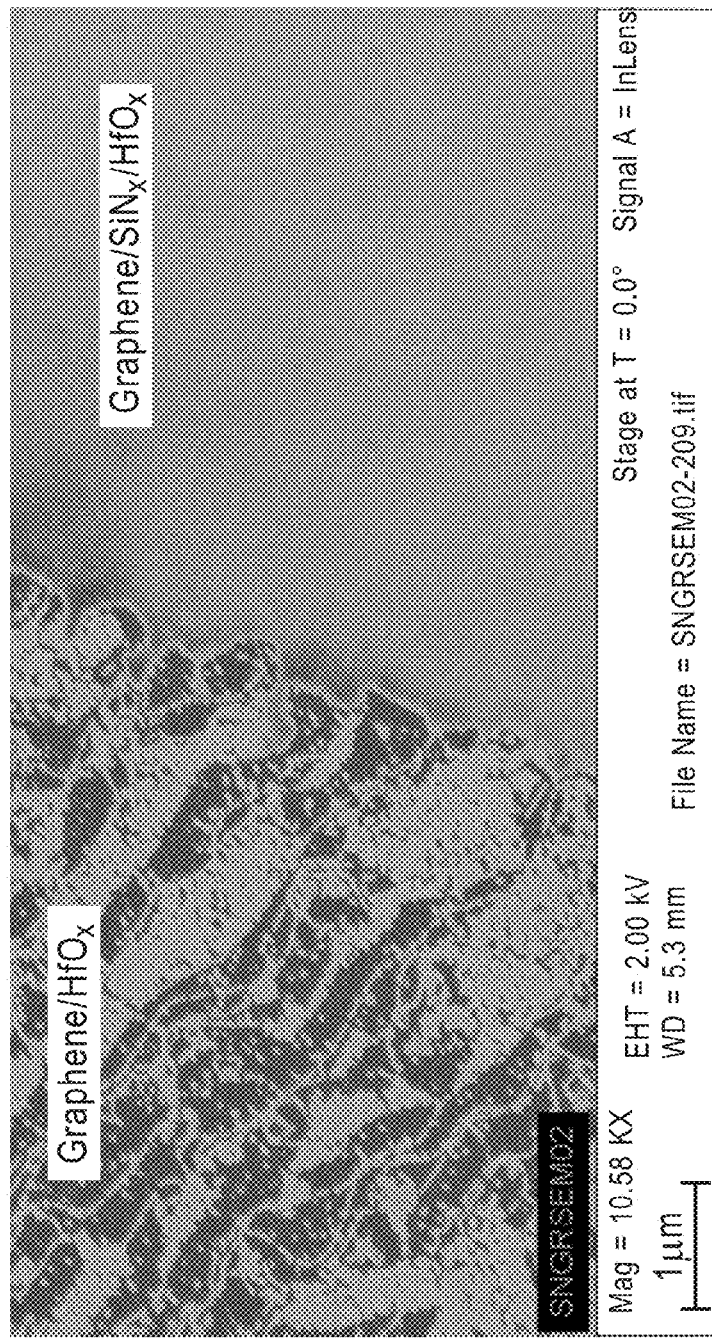
FIG. 15 is a side-by-side SEM comparison of the structures provided in Examples 1 and 2 of the present disclosure. The uniform area on the right has a SiN$_X$ layer between graphene and HfO$_2$. The area on the left does not have a SiN$_x$ layer between graphene and HfO$_2$.

FIG. 15 is an actual side-by-side SEM comparison of the structures provided in Examples 1 and 2 of the present disclosure. The uniform area on the right has a SiN$_x$ layer between graphene and HfO$_2$. The area on the left does not have a SiN$_x$ layer between graphene and HfO$_2$.

In the graphene/HfO$_x$ region of the SEM (left hand side of the SEM), the darker shaded portions represent graphene, while the lighter shaded portions represent HfO$_2$. The right hand side of the SEM shows a uniform lighter shade, corresponding to HfO$_2$. Clearly, in the graphene/HfO$_x$ region of the SEM, the hafnium dioxide balled up forming discontinuous columnar HfO$_2$ which included leakage path ways, while no such leakage pathway were observed in the graphene/SiN$_x$/HfO$_x$ region as evidenced by the lack of any darker shaded portions, and the continuous, uniform shade that corresponds to HfO$_2$.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
a graphene layer located on an uppermost surface of a base substrate; and
a bilayer gate dielectric located on an uppermost surface of said graphene layer, wherein said bilayer gate dielectric includes, from bottom to top, a tensile silicon nitride layer and a HfO$_2$ layer, wherein said tensile silicon nitride layer and said HfO$_2$ layer are continuously present atop said uppermost surface of said graphene layer.

2. The semiconductor structure of claim 1, wherein said base substrate is a semiconductor material, a dielectric material, a conductive material or combinations thereof.

3. The semiconductor structure of claim 1, wherein said base substrate is comprised of SiC.

4. The semiconductor structure of claim 1, wherein said tensile silicon nitride layer has a thickness from 1 nm to 15 nm.

5. The semiconductor structure of claim 1, wherein said HfO$_2$ layer has a thickness from 2 nm to 500 nm.

6. The semiconductor structure of claim 1, wherein said graphene layer has an epitaxial relationship with said underlying base substrate.

7. A semiconductor device comprising:
a base substrate having an uppermost surface; and
a graphene-containing semiconductor device located on said uppermost surface of said base substrate, wherein said graphene-containing semiconductor device includes a graphene layer located on said uppermost surface of said base substrate, and a bilayer gate dielectric located on an uppermost surface of said graphene layer, wherein said bilayer gate dielectric includes, from bottom to top, a tensile silicon nitride layer and a HfO$_2$ layer, and wherein said tensile silicon nitride layer and said HfO$_2$ layer are continuously present atop said uppermost surface of said graphene layer.

8. The semiconductor device of claim 7, wherein said graphene-containing semiconductor device is a field effect transistor, and wherein at least a portion of said graphene layer serves as a channel of said field effect transistor.

9. The semiconductor device of claim 8, further comprising a source region in contact with one portion of said graphene layer and a drain region in contact with another portion of said graphene layer.

10. The semiconductor device of claim 9, further comprising a gate conductor located atop an uppermost surface of said HfO$_2$ layer and located between said source region and said drain region.

11. The semiconductor device of claim 10, wherein a portion of said bilayer gate dielectric is located on a sidewall and an upper surface of said source region and another portion of said bilayer gate dielectric is located on a sidewall and an upper surface of said drain region.

12. The semiconductor device of claim 9, wherein a portion of said source region is located on a portion of said uppermost surface of said graphene layer and a portion of said drain region is located on another portion of said uppermost surface of said graphene layer.

13. The semiconductor device of claim 9, wherein an outermost vertical sidewall portion of said source region is in direct contact with an outer vertical sidewall portion of said graphene layer and an outermost vertical sidewall portion of said drain region is in direct contact with another outer vertical sidewall portion of said graphene layer.

14. The semiconductor device of claim 7, wherein said base substrate is a semiconductor material, a dielectric material, a conductive material or combinations thereof.

15. The semiconductor device of claim 7, wherein said base substrate is comprised of SiC.

16. A method comprising:
providing a graphene layer on an uppermost surface of a base substrate;

forming a tensile silicon nitride layer on an uppermost surface of said graphene layer; and forming a HfO$_2$ layer on an uppermost surface of said tensile silicon nitride layer, wherein said tensile silicon nitride layer and said HfO$_2$ layer are continuously present atop said uppermost surface of said graphene layer.

17. The method of claim 16, wherein said providing said graphene layer comprises epitaxial growth.

18. The method of claim 17, wherein said epitaxial growth includes performing a first anneal in a dilute silicon-containing ambient, and performing a second anneal at a temperature from 1400° C. to 2000° C. in an inert ambient.

19. The method of claim 17, wherein said epitaxial growth includes performing a first anneal in a hydrogen-containing ambient and performing a second anneal at a temperature from 1400° C. to 2000° C. in an inert ambient.

20. The method of claim 18, further comprising performing an intermediate anneal in another dilute silicon-containing ambient at an intermediate temperature between a temperature of said first anneal, and said temperature of said second anneal.

21. The method of claim 18, wherein said first and second anneals are performed at a temperature from about 800° C. up to, but not beyond the melting point of silicon.

22. The method of claim 16, wherein said tensile silicon nitride layer is formed by plasma chemical vapor deposition at a temperature between 350° C. and 450° C.

23. The method of claim 16, further comprising forming a source region in contact with one portion of said graphene layer and a drain region in contact with another portion of said graphene layer, and forming a gate conductor on an uppermost surface of said HfO$_2$ layer and located between said source region and said drain region.

24. The method of claim 16, wherein said graphene layer is patterned prior to forming said tensile silicon nitride layer and said HfO$_2$ layer.

25. The method of claim 23, further comprising forming a source region in contact with one portion of said patterned graphene layer and a drain region in contact with another portion of said patterned graphene layer; and forming a gate conductor on an uppermost surface of said HfO$_2$ layer and located between said source region and said drain region, said source region and said drain region are formed prior to forming said tensile silicon nitride layer and said HfO$_2$ layer, and said gate conductor is formed after forming said tensile silicon nitride layer and said HfO$_2$ layer.

26. A semiconductor device comprising:
a base substrate having an uppermost surface; and
a graphene-containing semiconductor device located on said uppermost surface of said base substrate, wherein said graphene-containing semiconductor device is a field effect transistor and comprises:
a graphene layer located on said uppermost surface of said base substrate, wherein at least a portion of said graphene layer serves as a channel of said field effect transistor;
a bilayer gate dielectric located on an uppermost surface of said graphene layer, wherein said bilayer gate dielectric includes, from bottom to top, a silicon nitride layer and a HfO$_2$ layer, and wherein said silicon nitride layer and said HfO$_2$ layer are continuously present atop said uppermost surface of said graphene layer; and
a source region in contact with one portion of said graphene layer and a drain region in contact with another portion of said graphene layer, wherein a portion of said source region is located on a portion of said uppermost surface of said graphene layer and a portion of said drain region is located on another portion of said uppermost surface of said graphene layer.

27. A semiconductor device comprising:
a base substrate having an uppermost surface; and
a graphene-containing semiconductor device located on said uppermost surface of said base substrate, wherein said graphene-containing semiconductor device is a field effect transistor and comprises:
a graphene layer located on said uppermost surface of said base substrate, wherein at least a portion of said graphene layer serves as a channel of said field effect transistor;
a bilayer gate dielectric located on an uppermost surface of said graphene layer, wherein said bilayer gate dielectric includes, from bottom to top, a silicon nitride layer and a HfO$_2$ layer, and wherein said silicon nitride layer and said HfO$_2$ layer are continuously present atop said uppermost surface of said graphene layer;
a source region in contact with one portion of said graphene layer and a drain region in contact with another portion of said graphene layer; and
a gate conductor located atop an uppermost surface of said HfO$_2$ layer and located between said source region and said drain region, wherein a portion of said bilayer gate dielectric is located on a sidewall and an upper surface of said source region and another portion of said bilayer gate dielectric is located on a sidewall and an upper surface of said drain region.

* * * * *